US008282334B2

(12) United States Patent
Lindfors et al.

(10) Patent No.: US 8,282,334 B2
(45) Date of Patent: Oct. 9, 2012

(54) ATOMIC LAYER DEPOSITION APPARATUS AND LOADING METHODS

(75) Inventors: Sven Lindfors, Espoo (FI); Juha A. Kustaa-Adolf Poutiainen, Helsinki (FI)

(73) Assignee: Picosun Oy, Espoo (FI)

( * ) Notice: Subject to any disclaimer, the term of this patent is extended or adjusted under 35 U.S.C. 154(b) by 475 days.

(21) Appl. No.: 12/221,268

(22) Filed: Aug. 1, 2008

(65) Prior Publication Data
US 2010/0028122 A1    Feb. 4, 2010

(51) Int. Cl.
*H01L 21/677* (2006.01)
(52) U.S. Cl. .............. 414/806; 414/217; 414/222.01; 414/805; 414/940
(58) Field of Classification Search ............ 414/217, 414/222.06, 222.12, 222.13, 222.01, 225.01, 414/805, 806, 940
See application file for complete search history.

(56) References Cited

U.S. PATENT DOCUMENTS

| | | | |
|---|---|---|---|
| 4,582,720 A | 4/1986 | Yamazaki | 427/38 |
| 5,037,775 A | 8/1991 | Reisman | 437/89 |
| 5,674,039 A * | 10/1997 | Walker et al. | 414/222.05 |
| 5,799,995 A * | 9/1998 | Bergam et al. | 294/27.1 |
| 6,050,446 A * | 4/2000 | Lei et al. | 220/819 |
| 6,145,397 A * | 11/2000 | Nzeadibe et al. | 74/97.1 |
| 6,395,101 B1 * | 5/2002 | Scranton et al. | 134/32 |
| 6,413,355 B1 * | 7/2002 | Kamikawa et al. | 156/345.11 |
| 6,517,634 B2 * | 2/2003 | Pang et al. | 118/715 |
| 6,585,823 B1 | 7/2003 | Van Wijck | 117/89 |
| 6,719,851 B1 * | 4/2004 | Kurita et al. | 134/8 |
| 6,835,416 B2 | 12/2004 | Kilpi | 427/255.28 |
| 6,846,149 B2 | 1/2005 | Savage et al. | 414/416 |
| 6,905,549 B2 | 6/2005 | Okuda et al. | 118/715 |
| 6,916,374 B2 | 7/2005 | Sandhu et al. | 117/105 |
| 7,002,134 B2 * | 2/2006 | Chu et al. | 250/221 |
| 7,022,184 B2 | 4/2006 | Van Wijck | 117/201 |
| 7,112,544 B2 | 9/2006 | Doan et al. | 438/791 |
| 7,654,221 B2 * | 2/2010 | Lubomirsky et al. | 118/52 |
| 7,798,096 B2 | 9/2010 | Mahajani et al. | 118/723 E |
| 2001/0014371 A1 | 8/2001 | Kilpi | 427/255.28 |
| 2002/0064440 A1 * | 5/2002 | Ikeda et al. | 414/222.01 |
| 2002/0108570 A1 | 8/2002 | Lindfors | 118/715 |
| 2004/0007581 A1 * | 1/2004 | Nguyen et al. | 220/819 |

(Continued)

FOREIGN PATENT DOCUMENTS

| | | |
|---|---|---|
| JP | 2001240972 A | 9/2001 |
| WO | WO 2005/021831 A1 | 3/2005 |
| WO | WO-2009/144371 A1 | 12/2009 |

OTHER PUBLICATIONS

"Surface Chemistry of Atomic Layer Deposition: A case study for the trimethyaluminum/water process", J. Appl. Phys., 97 (2005), p. 121301 by R. Ruurunen.

(Continued)

*Primary Examiner* — Scott Lowe
(74) *Attorney, Agent, or Firm* — Harrington & Smith

(57) ABSTRACT

The invention relates to methods and apparatus in which a plurality of ALD reactors are placed in a pattern in relation to each other, each ALD reactor being configured to receive a batch of substrates for ALD processing, and each ALD reactor comprising a reaction chamber accessible from the top. A plurality of loading sequences is performed with a loading robot. Each loading sequence comprises picking up a substrate holder carrying a batch of substrates in a storage area or shelf, and moving said substrate holder with said batch of substrates into the reaction chamber of the ALD reactor in question.

17 Claims, 3 Drawing Sheets

U.S. PATENT DOCUMENTS

| | | | |
|---|---|---|---|
| 2004/0018122 A1* | 1/2004 | Micklash et al. | 422/130 |
| 2004/0065258 A1 | 4/2004 | Sandhu et al. | 118/722 |
| 2005/0183664 A1 | 8/2005 | Hwang et al. | 118/715 |
| 2005/0186338 A1 | 8/2005 | Roscheisen et al. | 427/248.1 |
| 2006/0156979 A1 | 7/2006 | Thakur et al. | 118/715 |
| 2006/0196418 A1* | 9/2006 | Lindfors et al. | 118/715 |
| 2008/0213479 A1 | 9/2008 | Chou et al. | 427/255.393 |
| 2009/0297710 A1 | 12/2009 | Lindfors | 427/255.28 |
| 2010/0028122 A1 | 2/2010 | Lindfors et al. | 414/806 |

OTHER PUBLICATIONS

U.S. Appl. No. 12/154,879, filed May 27, 2008, "Methods and Apparatus for Deposition Reactors", Applicant: Sven Lindfors.

Owyang, J., "Innovations in Batch ALD", Verano RVP-5500, Jul. 17, 2007, 15 pgs.

* cited by examiner

ATOMIC LAYER DEPOSITION APPARATUS AND LOADING METHODS

FIELD OF THE INVENTION

The present invention relates to Atomic Layer Deposition (ALD) apparatus and loading methods.

BACKGROUND OF THE INVENTION

Atomic Layer Epitaxy (ALE) method was invented by Dr. Tuomo Suntola in the early 1970's. Another generic name for the method is Atomic Layer Deposition (ALD) and it is nowadays used instead of ALE. ALD is a special chemical deposition method based on the sequential introduction of at least two reactive precursor species to a substrate that is located within a heated reaction space. The growth mechanism of ALD relies on the bond strength differences between chemical adsorption (chemisorption) and physical adsorption (physisorption). ALD utilizes chemisorption and eliminates physisorption during the deposition process. During chemisorption a strong chemical bond is formed between atom(s) of a solid phase surface and a molecule that is arriving from the gas phase. Bonding by physisorption is much weaker because only van der Waals forces are involved. Physisorption bonds are easily broken by thermal energy when the local temperature is above the condensation temperature of the molecules.

By definition the reaction space of an ALD reactor comprises all the heated surfaces that can be exposed alternately and sequentially to each of the ALD precursor used for the deposition of thin films. A basic ALD deposition cycle consists of four sequential steps: pulse A, purge A, pulse B and purge B. Pulse A typically consists of metal precursor vapor and pulse B of non-metal precursor vapor, especially nitrogen or oxygen precursor vapor. Inactive gas, such as nitrogen or argon, and a vacuum pump are used for purging gaseous reaction by-products and the residual gaseous reactant molecules from the reaction space during purge A and purge B. A deposition sequence comprises at least one deposition cycle. Deposition cycles are repeated until the deposition sequence has produced a thin film of desired thickness.

Precursor species form through chemisorption a chemical bond to reactive sites of the heated surfaces. Conditions are typically arranged in such a way that no more than a molecular monolayer of a solid material forms on the surfaces during one precursor pulse. The growth process is thus self-terminating or saturative. For example, the first precursor can include ligands that remain attached to the adsorbed species and saturate the surface, which prevents further chemisorption. Reaction space temperature is maintained above condensation temperatures and below thermal decomposition temperatures of the utilized precursors such that the precursor molecule species chemisorb on the substrate(s) essentially intact. Essentially intact means that volatile ligands may come off the precursor molecule when the precursor molecules species chemisorb on the surface. The surface becomes essentially saturated with the first type of reactive sites, i.e. adsorbed species of the first precursor molecules. This chemisorption step is typically followed by a first purge step (purge A) wherein the excess first precursor vapor and possible reaction by-product vapors are removed from the reaction space. Second precursor vapor is then introduced into the reaction space. Second precursor molecules typically react with the adsorbed species of the first precursor molecules, thereby forming the desired thin film material. This growth terminates once the entire amount of the adsorbed first precursor has been consumed and the surface has essentially been saturated with the second type of reactive sites. The excess of second precursor vapor and possible reaction by-product vapors are then removed by a second purge step (purge B). The cycle is then repeated until the film has grown to a desired thickness. Deposition cycles can also be more complex. For example, the cycles can include three or more reactant vapor pulses separated by purging steps. All these deposition cycles form a timed deposition sequence that is controlled by a logic unit or a microprocessor.

Thin films grown by ALD are dense, pinhole free and have uniform thickness. For example, aluminum oxide grown from trimethylaluminum $(CH_3)_3Al$, also referred to as TMA, and water at 250-300° C. has usually about 1% non-uniformity over the 100-200 mm wafer. Metal oxide thin films grown by ALD are suitable for gate dielectrics, electroluminescent display insulators, capacitor dielectrics and passivation layers. Metal nitride thin films grown by ALD are suitable for diffusion barriers, e.g., in dual damascene structures.

Precursors suitable for ALD processes in various ALD reactors are disclosed, for example, in review article R. Puurunen, "*Surface chemistry of atomic layer deposition: A case study for the trimethylaluminum/water process*", *J. Appl. Phys.*, 97 (2005), p. 121301, which is incorporated herein by reference.

In a typical reactor, ALD deposition cycles are applied to a single wafer or substrate. While this kind of single wafer processing may be satisfactory for an R&D purpose, it does not meet, e.g., the requirements of affordable mass production, such as the through-put of the product or mean time between service.

The patent application U.S. Ser. No. 12/154,879 filed on 27 May 2008 and assigned to the same assignee as the present application, the contents of which is incorporated herein by reference, presents a solution improving a through-put of an ALD reactor. In that solution a batch of substrates is loaded into a vertical flow reactor in a substrate holder, and the whole batch of substrates in the reactor is processed simultaneously to improve through-put. Although this presents a major step towards mass production compared to single substrate reactors, there is a need to improve the through-put even more.

SUMMARY

According to a first aspect of the invention there is provided an atomic layer deposition (ALD) reactor system comprising:

a plurality of ALD reactors placed in a pattern in relation to each other, each ALD reactor being configured to receive a batch of substrates for ALD processing, each ALD reactor comprising a reaction chamber accessible from the top; and a loading robot comprising a gripping part and a motion arrangement, the loading robot being configured to perform a plurality of loading sequences for loading each of said plurality of ALD reactors, each loading sequence comprising:

picking up with said gripping part a substrate holder carrying a batch of substrates in a storage area or shelf; and moving with said moving arrangement said substrate holder with said batch of substrates into the reaction chamber of the ALD reactor in question.

In certain embodiments, said loading robot is in each loading sequence configured to lower said substrate holder vertically into a reaction chamber from the top without passing a separate loading chamber. The number of ALD reactors of the system may be two or three or more.

In certain embodiments, a pre-filled cassette of wafers is loaded and unloaded with the aid of a loading robot.

In certain embodiments, the substrates are semiconductor wafers, such as silicon wafers, for example 3-12" wafers.

In certain embodiments, the substrates comprise 10-100000 pieces of three-dimensional parts such as 2-10 mm metal, glass or silica spheres, the substrates being in the pre-filled cassette during the loading sequence, the deposition process and the unloading sequence.

In certain embodiments, each ALD reactor comprises:
a lid-system comprising a reactor lid or vacuum chamber lid integrated with a reaction chamber lid; and
a lifting arrangement configured for lifting said lid-system up for loading the reaction chamber.

In certain embodiments, the ALD reactor system comprises a high efficiency particulate air filter hood, such as a HEPA filter hood, surrounding said plurality of ALD reactors, loading robot and storage area or shelf.

In certain embodiments, the loading robot is further configured to perform a plurality of unloading sequences for unloading each of said plurality of ALD reactors after ALD processing, each unloading sequence comprising:
picking up with said gripping part a substrate holder carrying a batch of ALD processed substrates from an ALD reactor in question; and
moving with said motion arrangement said substrate holder with the batch of ALD processed substrates to said storage area or shelf.

According to a second aspect of the invention there is provided a method comprising:
operating a plurality of ALD reactors placed in a pattern in relation to each other, each ALD reactor being configured to receive a batch of substrates for ALD processing, and each ALD reactor comprising a reaction chamber accessible from the top;
performing a plurality of loading sequences with a loading robot for loading each of said plurality of ALD reactors, each loading sequence comprising:
picking up a substrate holder carrying a batch of substrates in a storage area or shelf; and
moving said substrate holder with said batch of substrates into the reaction chamber of the ALD reactor in question.

In certain embodiments, in each loading sequence said substrate holder is lowered by said loading robot vertically into a reaction chamber from the top without passing a separate loading chamber.

In certain embodiments, the method comprises arranging a high efficiency particulate air filter hood, such as a HEPA filter hood, to surround said plurality of ALD reactors, loading robot and said storage area or shelf.

In certain embodiments, said loading sequences are performed by a single robot without human operator.

In certain embodiments, the method further comprises performing a plurality of unloading sequences with the loading robot for unloading each of said plurality of ALD reactors after ALD processing, each unloading sequence comprising:
picking up a substrate holder carrying a batch of ALD processed substrates from an ALD reactor in question; and
moving said substrate holder with the batch of ALD processed substrates to said storage area or shelf.

In all embodiments, it is not necessary to have a plurality of ALD reactors but a single ALD reactor will suffice in certain embodiments. Accordingly, yet another aspect of the invention provides an atomic layer deposition (ALD) reactor system comprising:
an ALD reactor configured to receive a batch of substrates for ALD processing, and comprising a reaction chamber accessible from the top; and a loading robot comprising a gripping part and a motion arrangement, the loading robot being configured to perform a loading sequence for loading said ALD reactor, the loading sequence comprising:
picking up with said gripping part a substrate holder carrying a batch of substrates in a storage area or shelf; and
moving with said moving arrangement said substrate holder with said batch of substrates into the reaction chamber of the ALD reactor.

Advantages of certain aspects and/or embodiments of the invention involve improving through-put in ALD reactors, cost-efficiency, and reducing ALD reactor loading (and unloading) time.

Various exemplary embodiments of the present invention are illustrated hereinafter in the detailed description of the invention as well as in the dependent claims appended hereto. The embodiments are illustrated with reference to selected aspects of the invention. A person skilled in the art appreciates that any embodiment of the invention may be combined with other embodiment(s) within the same aspect. Furthermore, any embodiment may apply to other aspects as well either alone or in combination with other embodiment(s).

BRIEF DESCRIPTION OF THE DRAWINGS

The invention will now be described, by way of example only, with reference to the accompanying drawings, in which.

DETAILED DESCRIPTION

The basics of an ALD growth mechanism are known to a skilled person. Details of ALD methods have also been described in the introductory portion of this patent application. These details are not repeated here but a reference is made to the introductory portion with that respect.

Figure 1:
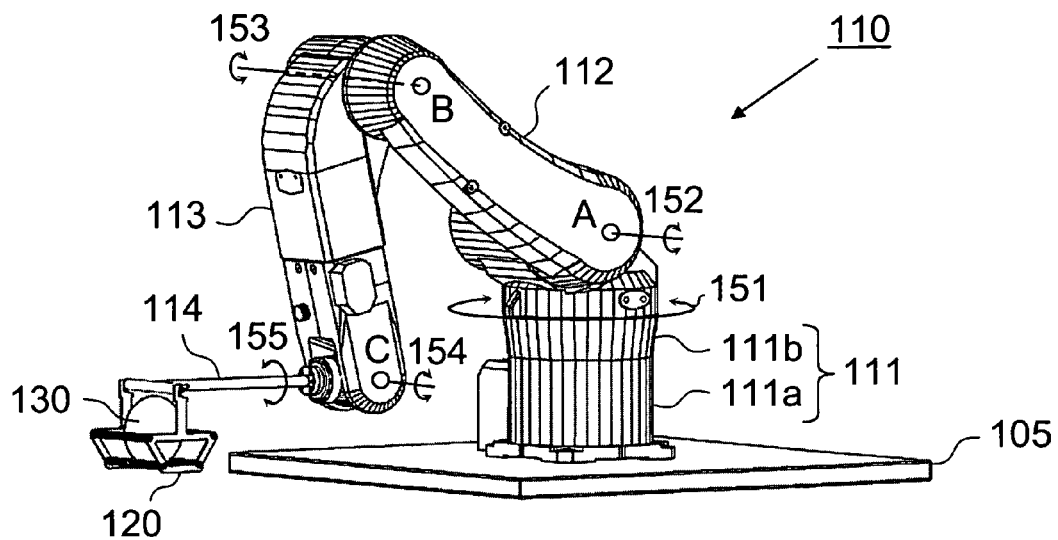
FIG. 1 shows a loading robot of an ALD reactor system in accordance with an embodiment.

FIG. 1 shows an example of a loading robot of an ALD reactor system in accordance with an embodiment. The loading robot 110 is attached onto a base 105 and comprises a set of arms 111-114 rotatably attached to each other. The arms 111-114 are controlled by a computerized control system (not shown) so as to obtain desired movement.

The loading robot 110 is attached to the base 105 from the lower part 111a of arm 111 by bolts or other suitable attachment. The upper part 111b of arm 111 and other parts of the loading robot 110 attached thereto are rotatable in a horizontal plane as depicted by arrow 151. The arm 112 is attached to arm 111 by a joint and is rotatable around rotation axis A as depicted by arrow 152. The arm 113 is attached to arm 112 by a joint and is rotatable around rotation axis B as depicted by arrow 153. The arm 114 is attached to arm 113 by a joint and is rotatable around rotation axis C as depicted by arrow 154. The arm 114 is also rotatable around its own longitudinal axis as depicted by arrow 155.

Figure 2:
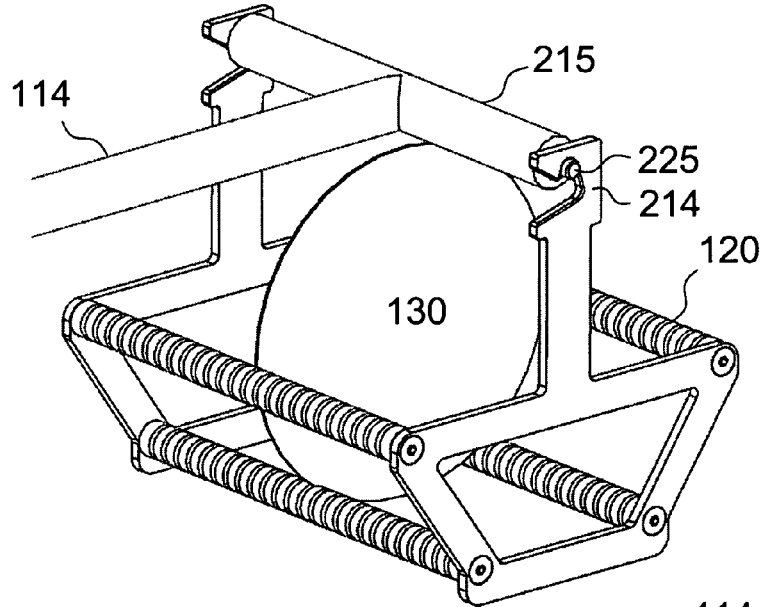
FIG. 2 shows a gripping arrangement in accordance with an embodiment.

The arm 114 shown in FIG. 1 and more closely in FIG. 2 comprises a T-shaped structure for gripping a substrate holder 120 carrying a batch of substrates 130. The batch typically comprises several vertically placed substrates (i.e., substrates whose surfaces form vertical planes), although only one substrate 130 has been shown in FIGS. 1 and 2. The number of substrates in one batch may extend from ten or few tens of substrates to hundreds of substrates depending on the embodiment and ALD reactor size. The substrates can be located in line with each other in the substrate holder 120, and when being is said line they can be parallel to each other as shown in U.S. Ser. No. 12/154,879. The substrates are supported by the substrate holder 120. The spacing between substrates is small in order to improve the efficiency of the reaction space. The spacing, however, is large enough to enable precursor flow to properly enter in between the substrates. In certain embodiments, substantially uniform spacing is typically selected from a range of 1-10 mm, in an embodiment from a range of 2-5 mm.

Figure 3:
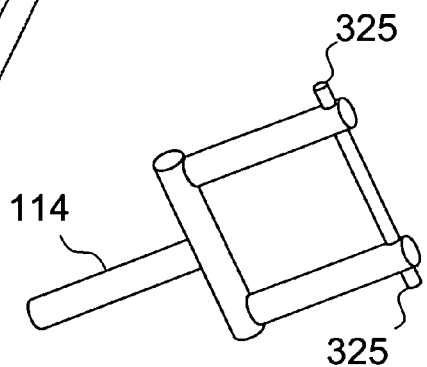
FIG. 3 shows an alternative embodiment.

The T-shaped structure may comprise, as shown in FIG. 2 the arm 114 and a bar 215 perpendicular to it. The bar 215 may have protrusions 225 in its both ends which fit into a corresponding lifting part or hook 214 of the substrate holder 120. The protrusions 225 then carry the substrate holder. Alternatively, the end of the arm 114 can be shaped as shown in FIG. 3 to provide an alternative structure. In this embodiment, the arm 114 contains two finger-like portions that are joined together by a bar perpendicular to them, the bar protruding through the finger-like portions so that the protrusions 325 fit into the corresponding lifting part or hook 214 of the substrate holder 120. Also other alternatives for the arm 114 to carry the substrate holder 120 are possible and can be implemented depending on the embodiment.

The substrate holder 120 material typically comprises stainless steel, nickel, titanium, silicon carbide (e.g. SiC made from graphite by chemical vapor infiltration) or quartz. In an embodiment the substrate holder 120 is coated with an amorphous thin film (e.g. 100-200 nm of $Al_2O_3$) to protect the holder surface against corrosive source chemicals before taking the substrate holder in use.

Figure 4:
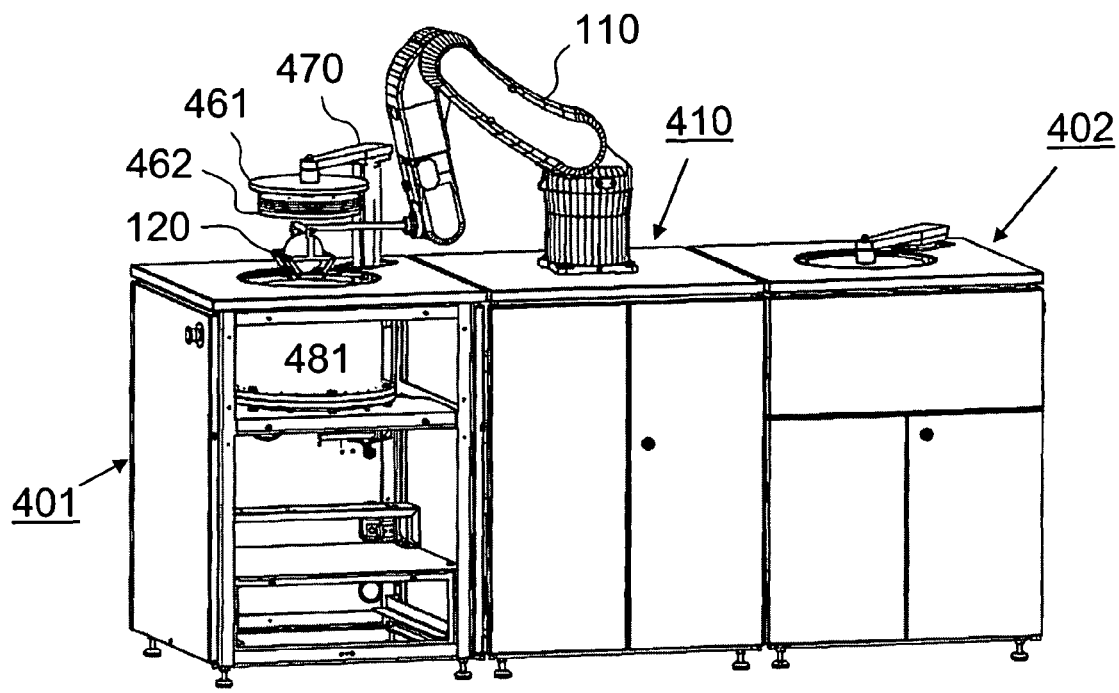
FIG. 4 shows parts of an ALD reactor system in accordance with an embodiment.

FIG. 4 shows parts of an ALD reactor system in accordance with an embodiment. The system comprises a first ALD reactor cabinet 401 comprising a first ALD reactor 481. The ALD reactor 481 is be a vertical flow reactor accessible from the top, although other ALD reactor constructions are also possible. In an embodiment, the reactor 481 comprises a vacuum chamber which is formed by a round fitting, e.g. ISO full nipple with flanges bolted to the nipple, or a CF fitting or similar. The width of the fitting is large enough to accommodate a reaction chamber for a batch of 100-300 mm wafers and heaters depending on the embodiment. In an embodiment, the lid of the reactor is arranged so that a vacuum chamber lid 461 is integrated with a reaction chamber lid 462 thereby forming a lid system. The lid system can by raised and lowered by a lifting mechanism 470. The lifting mechanism 470 can be operated with a pneumatic elevator and its movement controlled by a computer (not shown). In other embodiments a stepper motor can be used instead of the pneumatic elevator.

The system shown in FIG. 4 further comprises a second ALD reactor cabinet 402 comprising a second ALD reactor which may be similar to ALD reactor 481 (but whose lid only is shown in FIG. 4) and a loading robot 110 placed in between the ALD reactors. The loading robot is attached into a base that is formed in the example shown in FIG. 4 by a cabinet 410. The single loading robot 110 serves (loads and unloads) both mentioned ALD reactors, but in an alternative embodiment the ALD reactor system can comprise only one ALD reactor instead of two.

Figure 5:
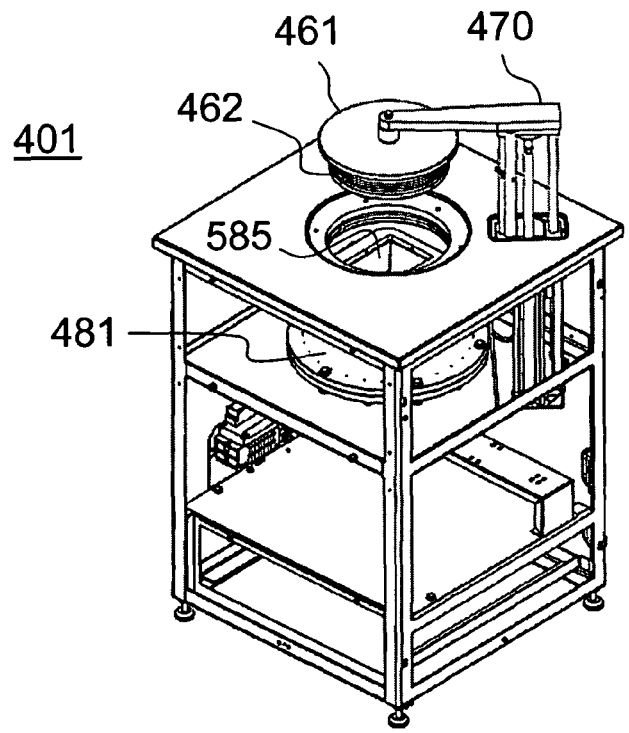
FIG. 5 shows a lifting mechanism in accordance with an embodiment.

In the example shown in FIG. 4, the loading robot 110 is presently loading the ALD reactor 481. In an embodiment, the ALD reactor 481 has been vented from deposition pressure (typically 1-10 hPa) to room pressure (typically 950-1050 hPa). A batch of substrates is loaded simultaneously. The lid (or the combined lid-system) of the ALD reactor 481 has been raised by the lifting mechanism 470 into an upper position exposing the internal space of a reaction chamber. This has been more closely shown in FIG. 5 in which reference numeral 585 depicts the internal space of the reaction chamber.

The loading robot 110 receives or grips a substrate holder 120 carrying a batch of substrates to be ALD processed in a loading station (loading space/storage area or rack/shelf, not shown). In practice, the loading robot 110 may grip the substrate holder 120 with its gripping part or arm 114 having the suitable protrusion(s) 225 or 325, or similar. The movement of the loading robot 110 is controlled by a computerized control system (not shown) thereby producing a motion arrangement for moving the substrate holder 120 with substrates 130. The loading robot 110 carries the substrate holder 120 with the batch of substrates 130 from the loading station towards the ALD reactor 481. In the close proximity of ALD reactor 481 the loading robot 110 moves the substrate holder 120 mainly in a horizontal direction above the aperture leading into the reaction chamber. Subsequently, the loading robot 110 lowers the substrate holder 120 with the batch of substrates 130 in a mainly vertical direction onto the bottom of the reaction chamber. Thereupon, the loading robot 110 releases its grip of the substrate holder 120 and moves the arm 114 away from the reactor. The reactor lid is lowered into a closed position by the lifting mechanism 470. The reaction chamber is evacuated from room pressure to vacuum. The process pressure is adjusted with flowing inactive gas such as nitrogen gas typically to about 1-10 hPa. The substrate temperature can be stabilized to process temperature (typically to about +80 . . . +500° C.) within the (hot wall) reaction chamber.

The first ALD reactor 481 performs ALD processing (comprising a desired amount of ALD deposition cycles) to the loaded batch of substrates 130. After ALD processing, the reaction chamber is vented to room pressure, the reactor lid is raised by the lifting mechanism 470 into the upper position, and the loading robot 110 unloads the substrate holder 120 with the ALD processed batch of substrates 130 from the ALD reactor. The loading robot 110 carries the substrate holder 120 with said batch of substrates 130 to an unloading station (which may be the same or different station as the loading station mentioned in the preceding). The loading and unloading operations can be performed by a single loading robot 110. Suitable electronics of the ALD reactor(s) and the loading robot communicate with each other for carrying out proper sequences of operations.

The loading and unloading of the system's second ALD and any further reactor are performed similarly. All ALD reactors can be loaded first before ALD processing is started in any of the ALD reactors. Alternatively, the loading robot 110 may load or unload certain ALD reactors while others are processing in accordance with an appropriate operating schedule.

Figure 6:
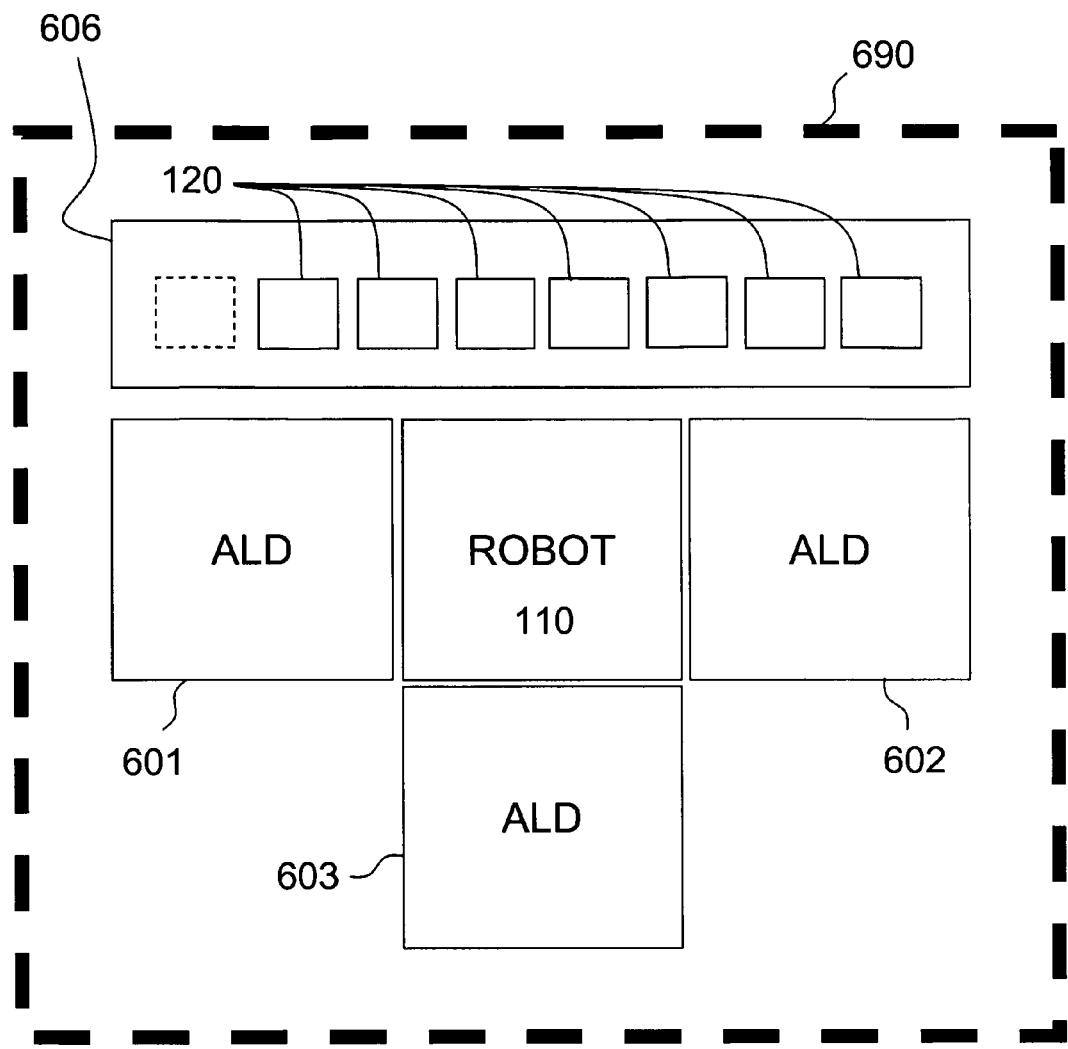
FIG. 6 shows an ALD reactor system layout in accordance with an embodiment.

FIG. 6 shows an ALD reactor system layout in accordance with an embodiment. The system comprises a plurality of ALD reactors placed in a pattern in relation to each other. In this example, the number of reactors is three and the pattern therefore is a triangular pattern. A single loading robot 110 serves each of the ALD reactors 601, 602 and 603. The robot 110 picks up a pre-filled substrate holder (or cassette) 120 from a storage area or rack 606 for loading it into one of the reactors 601-603 and returns it after ALD processing back to its place and picks up the next pre-filled one.

In an embodiment, the storage area or rack 606 comprises a computer-controlled positioning table such as a slide table for setting substrate holder(s) to an optimum handling position for the loading robot.

In this embodiment, although also applicable in other embodiments, a high efficiency particulate air (HEPA) filter hood 690 is arranged to surround the ALD reactor system (reactors, loading robot and storage area or shelf) for preventing impurity particles from entering the reactors or substrate holder(s). In this way a local clean room can be created. In an embodiment, cleaned air is guided from hood ceiling towards the floor to form preferably laminar air flow. The local clean room can be constructed, for example, within a bigger room. The loading, ALD processing and unloading operations are performed within said local clean room by the loading robot and ALD reactor(s) without a human operator's residence in the local clean room.

Various embodiments have been presented. It should be appreciated that in this document, words comprise, include and contain are each used as open-ended expressions with no intended exclusivity.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means without deviating from the characteristics of the invention.

Furthermore, some of the features of the above-disclosed embodiments of this invention may be used to advantage without the corresponding use of other features. As such, the foregoing description should be considered as merely illustrative of the principles of the present invention, and not in limitation thereof. Hence, the scope of the invention is only restricted by the appended patent claims.

The invention claimed is:

1. An atomic layer deposition (ALD) reactor system comprising:
   a plurality of vertical flow ALD reactors placed in a pattern in relation to each other, each ALD reactor being configured to receive a batch of substrates for ALD processing, each ALD reactor comprising a lid system having a vacuum chamber lid and a reaction chamber lid, and a vacuum chamber accommodating a reaction chamber accessible from the top for loading of the substrates; and
   a loading robot comprising a gripping part and a motion arrangement, the loading robot being configured to perform a plurality of loading sequences for loading the reaction chamber of each of said plurality of ALD reactors from the top of the reaction chamber, each loading sequence comprising:
   raising the lid system into an upper position;
   picking up with said gripping part a substrate holder carrying a batch of substrates in a storage area or shelf; and
   moving with said moving arrangement said substrate holder with said batch of substrates into the reaction chamber without passing a separate loading chamber, from the top of the reaction chamber, of the ALD reactor in question.

2. The ALD reactor system of claim 1, wherein said loading robot is in each loading sequence configured to lower said substrate holder vertically into a reaction chamber from the top without passing a separate loading chamber.

3. The ALD reactor system of claim 1, wherein the number of ALD reactors of the system is two or three.

4. The ALD reactor system of claim 1, wherein each ALD reactor comprises:
   the lid-system comprising a reactor lid or the vacuum chamber lid integrated with the reaction chamber lid; and
   a lifting arrangement configured for lifting said lid-system up for loading the reaction chamber.

5. The ALD reactor system of claim 1, comprising a high efficiency particulate air filter hood surrounding said plurality of ALD reactors, loading robot and storage area or shelf.

6. The ALD reactor system of claim 1, configured for performing said loading sequences by a single robot without human operator.

7. The ALD reactor system of claim 1, wherein the loading robot is configured to perform a plurality of unloading sequences for unloading each of said plurality of ALD reactors after ALD processing, each unloading sequence comprising:
   picking up with said gripping part a substrate holder carrying a batch of ALD processed substrates from an ALD reactor in question; and
   moving with said motion arrangement said substrate holder with the batch of ALD processed substrates to said storage area or shelf.

8. A method comprising:
   operating a plurality of vertical flow ALD reactors placed in a pattern in relation to each other, each ALD reactor being configured to receive a batch of substrates for ALD processing, and each ALD reactor comprising a lid system having a vacuum chamber lid and a reaction chamber lid, and a vacuum chamber accommodating a reaction chamber accessible from the top for loading of the substrates;
   performing a plurality of loading sequences with a loading robot for loading the reaction chamber of each of said plurality of ALD reactors from the top of the reaction chamber, each loading sequence comprising: raising the lid system into an upper position, picking up a substrate holder carrying a batch of substrates in a storage area or shelf; and
   moving said substrate holder with said batch of substrates into the reaction chamber without passing a separate loading chamber, from the top of the reaction chamber, of the ALD reactor in question.

9. The method of claim 8, wherein in each loading sequence said substrate holder is lowered, by said loading robot vertically into a reaction chamber from the top without passing a separate loading chamber.

10. The method of claim 8, wherein the number of ALD reactors of the system is two or three.

11. The method of claim 8, wherein each ALD reactor comprises the lid-system comprising a reactor lid or the vacuum chamber lid integrated with the reaction chamber lid, the method comprising:
    lifting said lid-system up for loading the reaction chamber.

12. The method of claim 8, comprising:
    arranging a high efficiency particulate air filter hood to surround said plurality of ALD reactors, loading robot and said storage area or shelf, thereby forming a local clean room.

13. The method of claim 8, wherein said loading sequences are performed by a single robot without human operator.

14. The method of claim 8, further comprising performing a plurality of unloading sequences with the loading robot for unloading each of said plurality of ALD reactors after ALD processing, each unloading sequence comprising:
- picking up a substrate holder carrying a batch of ALD processed substrates from an ALD reactor in question; and
- moving said substrate holder with the batch of ALD processed substrates to said storage area or shelf.

15. An atomic layer deposition (ALD) reactor system comprising:
- a vertical flow ALD reactor configured to receive a batch of substrates for ALD processing, and comprising a lid system having a vacuum chamber lid and a reaction chamber lid, and a vacuum chamber accommodating a reaction chamber accessible from the top for loading of the substrates; and
- a loading robot comprising a gripping part and a motion arrangement, the loading robot being configured to perform a loading sequence for loading the reaction chamber of said ALD reactor from the top of the reaction chamber, the loading sequence comprising:
  - raising the lid system into an upper position;
  - picking up with said gripping part a substrate holder carrying a batch of substrates in a storage area or shelf; and
  - moving with said moving arrangement said substrate holder with said batch of substrates into the reaction chamber without passing a separate loading chamber, from the top of the reaction chamber, of the ALD reactor.

16. The method of claim 8, wherein the batch of substrates comprises vertically placed substrates.

17. The method of claim 8, wherein the method comprises performing said plurality of loading sequences in room pressure.

* * * * *